United States Patent
Arai (10) Patent No.: US 11,147,177 B2
(45) Date of Patent: Oct. 12, 2021

(54) TERMINAL CONTROL SUBSTRATE WHICH SWITCHES CONNECTION OF A CONTROLLER BETWEEN A FIRST MODULE FIXED TO A BASE PLATE AND AN EXTERNAL CONNECTION TERMINAL

(71) Applicants: Kabushiki Kaisha Toshiba, Minato-ku (JP); Toshiba Infrastructure Systems & Solutions Corporation, Kawasaki (JP)

(72) Inventor: Hideaki Arai, Kawasaki (JP)

(73) Assignees: Kabushiki Kaisha Toshiba, Minato-ku (JP); Toshiba Infrastructure Systems & Solutions Corporation, Kawasaki (JP)

( * ) Notice: Subject to any disclaimer, the term of this patent is extended or adjusted under 35 U.S.C. 154(b) by 218 days.

(21) Appl. No.: 15/684,250

(22) Filed: Aug. 23, 2017

(65) Prior Publication Data

US 2018/0077814 A1 Mar. 15, 2018

(30) Foreign Application Priority Data

Sep. 15, 2016 (JP) .............................. JP2016-180456

(51) Int. Cl.
*G06F 11/00* (2006.01)
*H05K 7/02* (2006.01)
(Continued)

(52) U.S. Cl.
CPC ......... *H05K 7/026* (2013.01); *G06F 11/2007* (2013.01); *H03K 19/00392* (2013.01); *G06F 2201/85* (2013.01)

(58) Field of Classification Search
CPC ............ G06F 11/1616; G06F 11/2033; G06F 11/1625; G06F 11/2005; G06F 11/2007; G06K 19/07739
See application file for complete search history.

(56) References Cited

U.S. PATENT DOCUMENTS 9,037,193 B2 5/2015 Vergnes et al.
9,294,919 B2 3/2016 Merrien et al.
(Continued)

FOREIGN PATENT DOCUMENTS

EP 1 699 021 A1 9/2006
JP 2001-177058 6/2001

OTHER PUBLICATIONS

Google Scholar/Patents—text refined (Year: 2021).*
Extended Search Report dated Feb. 19, 2018 in European Patent Application No. 17188155.0.

*Primary Examiner* — Christopher S McCarthy
(74) *Attorney, Agent, or Firm* — Oblon, McClelland, Maier & Neustadt, L.L.P.

(57) ABSTRACT

According to one embodiment, a terminal control substrate includes a base plate mounted on a terminal device, a first module fixed to the base plate, an external connection terminal fixed to the base plate and to which a component including a second module being a substitute for the first module is attachable, a controller configured to perform control in the terminal device by using the first module or the second module, and a switching unit configured to switch a connection destination of the controller to any one of the first module and the external connection terminal to which the second module is attached.

9 Claims, 4 Drawing Sheets

(51) Int. Cl.
*H03K 19/003* (2006.01)
*G06F 11/20* (2006.01)

(56) References Cited

U.S. PATENT DOCUMENTS

| | | | |
|---|---|---|---|
| 9,301,145 | B2 | 3/2016 | Merrien et al. |
| 9,326,146 | B2 | 4/2016 | Bradley |
| 9,408,066 | B2 | 8/2016 | Bradley |
| 9,462,475 | B2 | 10/2016 | Merrien et al. |
| 9,532,223 | B2 | 12/2016 | Girard et al. |
| 9,690,950 | B2 | 6/2017 | Vergnes et al. |
| 2006/0200586 | A1 | 9/2006 | Nakajima et al. |
| 2008/0070629 | A1* | 3/2008 | Yuan .............. H04W 8/183 455/558 |
| 2012/0190354 | A1 | 7/2012 | Merrien et al. |
| 2013/0318355 | A1 | 11/2013 | Girard et al. |
| 2013/0324091 | A1 | 12/2013 | Girard et al. |
| 2013/0329683 | A1 | 12/2013 | Berard et al. |
| 2014/0019760 | A1 | 1/2014 | Vergnes et al. |
| 2014/0024343 | A1 | 1/2014 | Bradley |
| 2014/0031083 | A1 | 1/2014 | Vergnes et al. |
| 2014/0057680 | A1 | 2/2014 | Proust et al. |
| 2014/0066011 | A1 | 3/2014 | Bradley |
| 2014/0122872 | A1 | 5/2014 | Merrien et al. |
| 2014/0141747 | A1 | 5/2014 | Merrien et al. |
| 2015/0038193 | A1 | 2/2015 | Vergnes et al. |
| 2015/0134958 | A1 | 5/2015 | Merrien et al. |
| 2015/0358501 | A1 | 12/2015 | Kawashima et al. |
| 2016/0134316 | A1 | 5/2016 | Mohan et al. |
| 2016/0379006 | A1 | 12/2016 | Merrien et al. |
| 2018/0014239 | A1* | 1/2018 | Chau .............. H04L 47/34 |
| 2018/0084597 | A1* | 3/2018 | Kanagarathinam ... H04W 76/15 |

\* cited by examiner

TERMINAL CONTROL SUBSTRATE WHICH SWITCHES CONNECTION OF A CONTROLLER BETWEEN A FIRST MODULE FIXED TO A BASE PLATE AND AN EXTERNAL CONNECTION TERMINAL

CROSS-REFERENCE TO RELATED APPLICATION

This application is based upon and claims the benefit of priority from Japanese Patent Application No. 2016-180456, filed on Sep. 15, 2016; the entire contents of which are incorporated herein by reference.

FIELD

Embodiments described herein relate generally to a terminal control substrate.

BACKGROUND

Conventionally, electronic components such as IC modules mounted on an electronic substrate are often fixed with solder on a circuit pattern above an electronic substrate unless detachment is necessary for operation. It is difficult to remove or replace the IC module fixed on the electronic substrate. Thus, in a case where IC modules fixed on the electronic substrate fail, it is necessary to take measures, such as replacement of the entire substrate, even if only one IC module fails.

That is, in a terminal device with an IC module or an IC card fixed on an electronic substrate, in a case where a failure occurs only in the IC module or the IC card, even if there is no abnormality in other electronic components or circuits on the electronic substrate, it is difficult to remove the IC module or the IC card. Thus, it is necessary to replace the electronic substrate or the terminal device itself, resulting in considerable waste in terms of cost.

DETAILED DESCRIPTION

According to one embodiment, there is provided a terminal control substrate including: a base plate mounted on a terminal device; a first module fixed to the base plate; an external connection terminal fixed to the base plate and to which a component including a second module being a substitute for the first module is attachable; a controller configured to perform control in the terminal device by using the first module or the second module; and a switching unit configured to switch a connection destination of the controller to any one of the first module and the external connection terminal to which the second module is attached.

Hereinafter, embodiments will be described with reference to the drawings.

An electronic substrate according to each embodiment described below is a terminal control substrate mounted on a terminal device so as to control the terminal device. The terminal device, on which the electronic substrate is mounted, is, for example, a terminal device which performs so-called machine to machine (M2M) communication, and is used for data collection, remote monitoring, remote control, and the like. As a specific example, the terminal device, on which the electronic substrate is mounted, is assumed to perform a smart grid which monitors the amount of power or controls the supply of power, a centralized control of machine tools, a remote monitoring of vending machines, a monitoring of an operation state of an elevator or the like, a monitoring of a traveling state of an automobile, and the like.

In general, the terminal device for M2M application as described above does not need to replace a SIM like a mobile phone, and needs to hold a reliable connection state of each electronic component on a base plate over a long period of time. For this reason, in the electronic substrate mounted on the terminal device, a package type embedded SIM (eSIM) is fixed on a base plate by solder or the like as an electronic component for performing network authentication or the like. For example, an eSIM which is an electronic component of M2M Form Factor 2 (MFF2) defined by ETSI TS 102.671 in accordance with ISO/IEC 7816 is mounted on an electronic substrate mounted on a terminal device of a smart grid.

In each of the following embodiments, an electronic substrate which is mounted on a terminal device for M2M application and on which at least one eSIM conforming to ISO/IEC 7816 is mounted (fixed) will be described, but each of the following embodiments is not limited thereto. That is, each of the following embodiments may also be applied to an electronic substrate mounted on a terminal device other than the M2M application. For example, each of the following embodiments is not limited to an electronic substrate mounted on a terminal device which communicates with the outside. Further, an electronic substrate to which each of the following embodiments is applied is not limited to an electronic substrate on which an eSIM is mounted, and may be applied to an electronic substrate on which electronic components other than the eSIM are mounted.

First Embodiment

Figure 1:
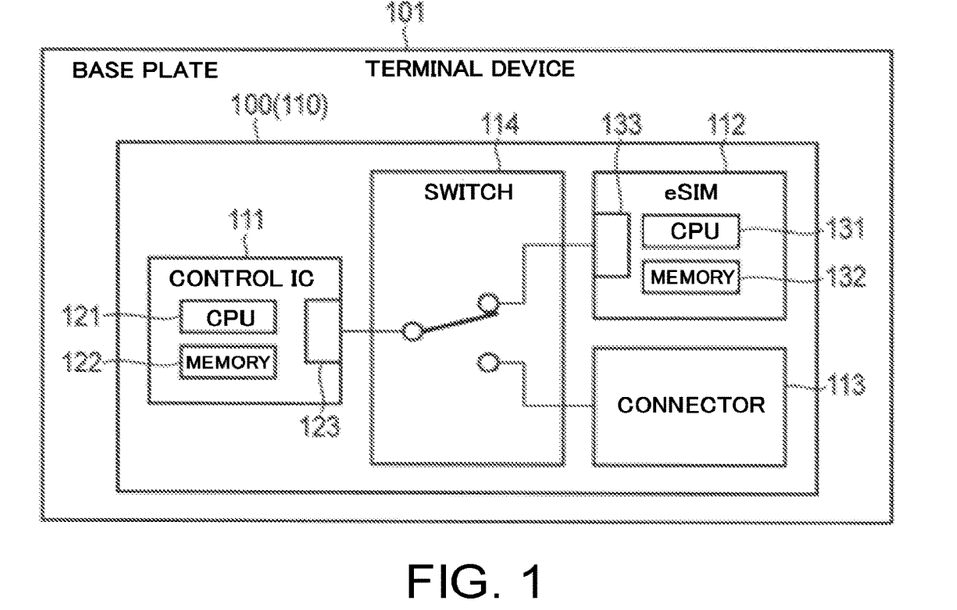
FIG. 1 is a diagram illustrating a configuration example of an electronic substrate (terminal control substrate) according to a first embodiment.

FIG. 1 is a diagram illustrating a configuration example of an electronic substrate 100 according to a first embodiment. The electronic substrate 100 is mounted on a terminal device 101. The electronic substrate 100 is a terminal control substrate which implements a configuration for controlling a part or all of functions realized by the terminal device 101. In the configuration example illustrated in FIG. 1, the electronic substrate 100 includes a base material (base plate) 110, a control IC (controller) 111, an eSIM (IC module) 112, a connector (external connection terminal) 113, and a switch 114. The control IC 111, the eSIM 112, the connector 113, and the switch 114 are mounted on the base plate 110.

The control IC 111 is a control unit and performs a control for realizing the function of the electronic substrate 100. For example, the control IC 111 is connected to an IC card or an IC module attached to the eSIM 112 or the connector 113 and performs communication control based on information memorized in the IC card or the IC module attached to the eSIM 112 or the connector 113.

The control IC 111 includes a CPU (processor) 121, a memory 122, and an interface 123. The processor 121 realizes various processing functions by executing a program memorized in the memory 122. The memory 122 includes a working memory such as a RAM, a program memory such as a ROM, a data memory such as a rewritable nonvolatile memory, and the like. The interface 123 is an interface for connecting to one of the eSIM 112 and the connector 113. Further, the control IC 111 includes an interface for connecting the respective units of the terminal device 101 other than the electronic substrate 100 of the terminal device 101.

The eSIM 112 is a first module and is an IC module mounted (fixed) on the base plate 110 by using solder. The eSIM is an IC module conforming to ISO/IEC 7816. The eSIM 112 performs processing corresponding to a supplied command and returns a command execution result as a response. The eSIM 112 performs, for example, communication authentication in a terminal device used for M2M application. Further, the eSIM 112 is, for example, an electronic component having an M2M Form Factor 2 (MFF2) shape defined by ETSI TS 102 671.

The eSIM 112 includes a CPU (processor) 131, a memory 132, and an interface 133. The processor 131 realizes various processing functions by executing a program memorized in the memory 132. For example, the processor 131 has a function of performing processing corresponding to a command from the control IC 111 and returning the processing result to the control IC 111. The memory 132 includes a working memory such as a RAM, a program memory such as a ROM, a data memory such as a rewritable nonvolatile memory, and the like. The interface 133 is an interface for communicating with the control IC 111.

The connector 113 is mounted (fixed) on the base plate 110. The connector 113 is an external connection terminal to which an IC card or an IC module having the same function as the eSIM 112 (a component including a second module) is attached. The IC card or the IC module attached to the connector 113 includes an IC module conforming to ISO/IEC 7816, performs processing corresponding to a supplied command, and returns a command execution result as a response. For example, when the eSIM 112 mounted on the base plate 110 fails, an IC card or an IC module having the same function as the eSIM is connected to the connector 113 as a substitute for the eSIM 112.

The IC card attached to the connector 113 is, for example, a card-shaped medium, such as an ID-1 size defined by ISO/IEC 7810:2003, Plug-in Universal Integrated Circuit Card (UICC) or Mini-UICC defined by ETSI TS 102 221, 4FF (fourth form factor) of a smaller size, or the like. In addition, any component may be connected to the connector 113 as long as the component has the same function as the SIM, and is not limited to and is not limited to a component having the IC card shape. For example, instead of a card having an MFF2 shape, a card having an IC module shape may be connected to the connector 113.

The switch 114 is a switch unit for switching a connection destination of the control IC 111. The switch 114 connects one of the eSIM 112 and the connector 113 to the interface 123 of the control IC 111. For example, it is assumed that, in an initial state, the switch 114 connects the control IC 111 and the eSIM 112. When the switch 114 connects the control IC 111 and the eSIM 112, the control IC 111 reads information written in the eSIM 112 and controls the terminal device 101 based on the information read from the eSIM 112.

For example, when a failure occurs in the eSIM 112, a maintenance worker sets the IC card instead of the eSIM 112 to the connector 113, and switches the switch 114 to a connection state of the control IC 111 and the connector 113. When the control IC 111 and the connector 113 are connected by the switch 114, the control IC 111 can communicate with the IC card set to the connector 113. When the control IC 111 and the IC card set to the connector 113 are communicatively connected, the control IC 111 reads information written in the IC card set to the connector 113 and controls the terminal device 101 based on the information read from the IC card.

In the electronic substrate 100 according to the first embodiment, instead of the connector 113, a second eSIM separate from the eSIM 112 may be mounted. That is, in the electronic substrate 100, the eSIM 112 and the second eSIM separate from the eSIM 112 may be mounted on the base plate 110, and one of the eSIM 112 and the second eSIM may be selected by the switch 114.

According to the first embodiment as described above, when a failure occurs in an electronic component such as the eSIM mounted (fixed) on the base plate, it is possible to provide a terminal control substrate capable of continuing the operation of the terminal device by setting a substitute for the failed electronic component to a predetermined location, without removing the failed electronic component from the base plate or replacing the entire electronic substrate or the terminal device itself.

For example, when only the eSIM fixed on the base plate by solder fails, it is not easy to physically replace only the eSIM on the base plate. However, according to the first embodiment, the connector capable of connecting the IC card or the IC module instead of the eSIM is provided on the base plate, and thus, when only the eSIM fails, it is unnecessary to exchange the base plate or the terminal device itself, and it is possible to operate the terminal device by setting the IC card to the connector provided on the base plate. As a result, it is possible to cope with the failure of the eSIM inexpensively and easily and to realize a continuous operation of the terminal device over a long period of time.

Second Embodiment

Figure 2:
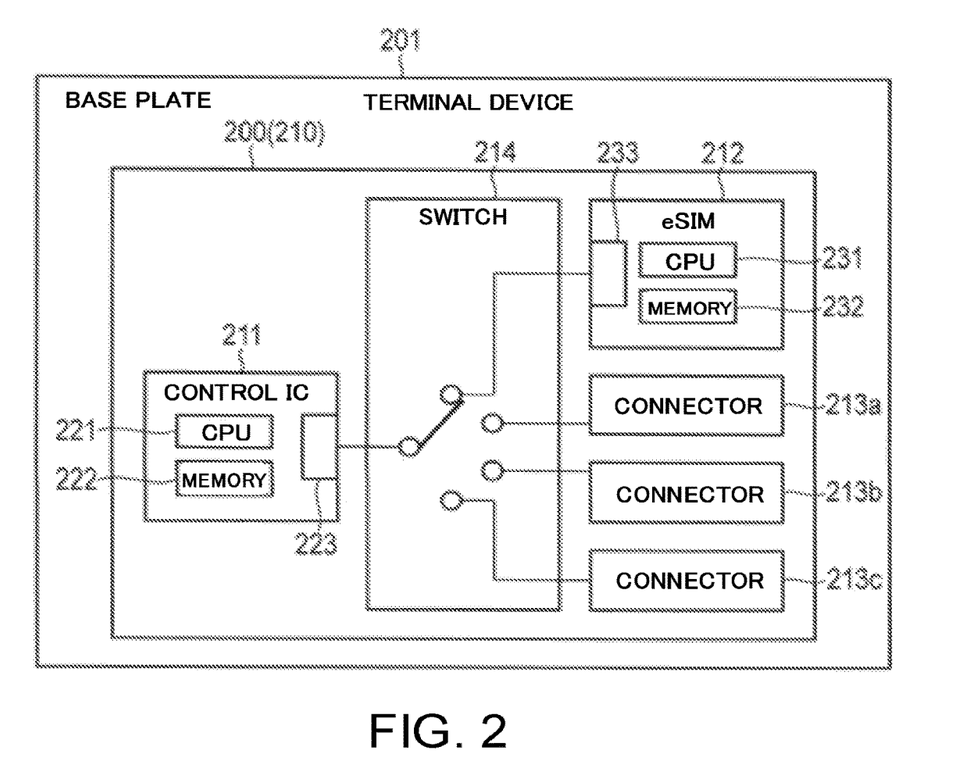
FIG. 2 is a diagram illustrating a configuration example of an electronic substrate according to a second embodiment.

FIG. 2 is a diagram illustrating a configuration example of an electronic substrate 200 according to a second embodiment. The electronic substrate 200 is a terminal control substrate for controlling a terminal device 201. The electronic substrate 200 illustrated in FIG. 2 is a configuration example of a case where there are a plurality of connectors to which an IC card is connectable instead of an eSIM. In the configuration example illustrated in FIG. 2, the electronic substrate 200 includes a base material (base plate) 210, a control IC (controller) 211, an eSIM (IC module) 212, a plurality of connectors (external connection terminals) 213 (213a, 213b, 213c), and a switch 214. The control IC 211, the eSIM 212, the plurality of connectors 213, and the switch 214 are mounted on the base plate 210.

Since the base material (base plate) 210, the control IC 211, and the eSIM 212 illustrated in FIG. 2 can be realized by the same elements as the base material (base plate) 110, the control IC 111, and the eSIM 112 illustrated in FIG. 1 which are described in the first embodiment, detailed descriptions thereof will be omitted.

The electronic substrate 200 illustrated in FIG. 2 differs from the electronic substrate 100 illustrated in FIG. 1, in that the plurality of connectors 213 are mounted on the base plate 210. In addition, the switch 214 of the electronic substrate 200 can connect the control IC 211 to the eSIM 212 or any one of the plurality of connectors 213. Each connector 213 may be any connector which conforms to ISO/IEC 7816 and matches a shape of a device that can be used as a substitute for the eSIM 212. For example, the connector 213a may be configured to correspond to a card shape, and the connector 213b may be configured to correspond to a shape of an electronic component such as an MFF2 smaller than that.

In the electronic substrate 200 according to the second embodiment, instead of any one of the plurality of connectors, an eSIM separate from the eSIM 212 may be mounted. In the electronic substrate 200, as the plurality of connectors 213, a combination of a connector and a second sSIM separate from the eSIM 212 may be mounted on the base plate 210. In this case, the switch 214 may be configured to select any one of the eSIM 212, the second eSIM, and the connector.

According to the second embodiment, in addition to the eSIM, the plurality of connectors or another eSIM are mounted on the electronic substrate, and thus, various types of components can be used as a substitute for the eSIM by switching them with the switch. As a result, according to the second embodiment, it is possible to provide an electronic substrate capable of coping with various operation modes, coping with the failure of the eSIM inexpensively and easily, and realizing a continuous operation of the terminal device over a long period of time.

Third Embodiment

Figure 3:
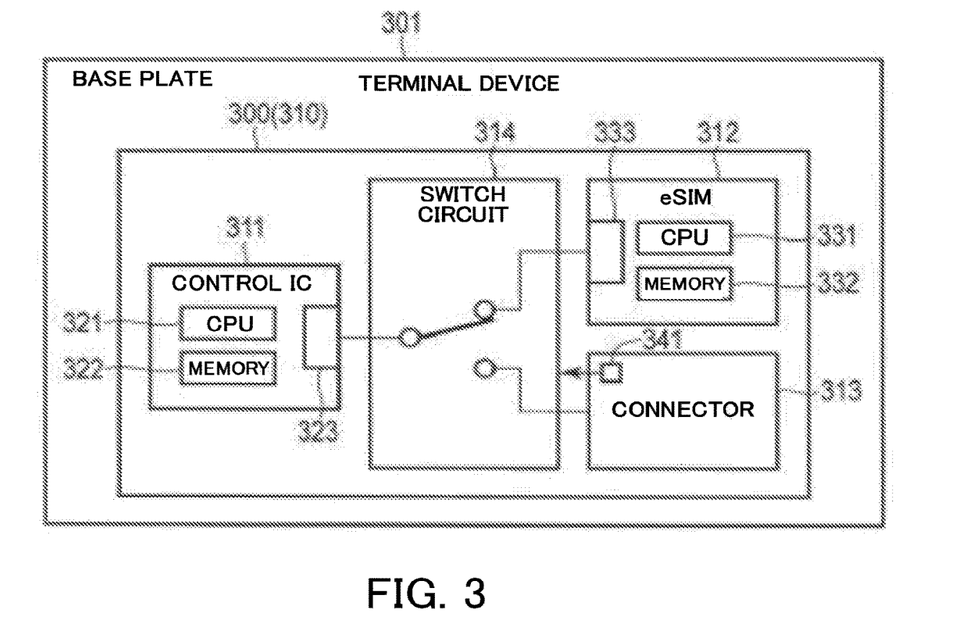
FIG. 3 is a diagram illustrating a configuration example of an electronic substrate according to a third embodiment.

FIG. 3 is a diagram illustrating a configuration example of an electronic substrate 300 according to a third embodiment. The electronic substrate 300 is a terminal control substrate for controlling a terminal device 301. A detector 341 which detects a connection of an IC card is provided in a connector to which an IC card is connectable instead of an eSIM, and the electronic substrate 300 illustrated in FIG. 3 further includes a switch circuit which operates according to a signal from the detector 341.

In the configuration example illustrated in FIG. 3, the electronic substrate 300 includes a base material (base plate) 310, a control IC 311, an eSIM (IC module) 312, a connector (external connection terminal) 313, and a switch circuit 314. The control IC 311, the eSIM 312, the connector 313, and the switch circuit 314 are mounted on the base plate 310. Since the base material (base plate) 310, the control IC 311, and the eSIM 312 illustrated in FIG. 3 can be realized by the same elements as the base material (base plate) 110, the control IC 111, and the eSIM 112 illustrated in FIG. 1 which are described in the first embodiment, detailed descriptions thereof will be omitted.

The electronic substrate 300 illustrated in FIG. 3 differs from the electronic substrate 100 illustrated in FIG. 1, in that the connector 313 includes the detector 341 and the switch circuit 314 is mounted instead of the switch 114. The detector 341 detects that the IC card or the IC module, which is a substitute for the eSIM 312, is connected to the connector 313. When the detector 341 detects that the IC card or the IC module is connected to the connector 313, the switch circuit 314 connects the connector 313 to the control IC 311.

The detector 341 may be any detector which detects that the IC card or the IC module is connected to the connector 313. For example, in a case where the IC card is inserted into the connector 313, the detector 341 may physically switch a state of the switch circuit 314. In addition, the detector 341 may detect a conducting state by the IC card connected to the connector 313 and supply the detection signal to the switch circuit 314 as a switching signal of a switch. Furthermore, the detector 341 may optically detect the insertion of the IC card into the connector 313 and supply the detection signal to the switch circuit 314 as a switching signal of a switch.

When the detector 341 detects that the IC card or the IC module is connected to the connector 313, the switch circuit 314 disconnects the eSIM 312 from the control IC 311 and connects the connector 313 to the control IC 311.

According to the third embodiment as described above, it is possible to provide an electronic substrate capable of automatically enabling the IC card or the IC module connected to the connector 313. In addition, according to the third embodiment, it is possible to enable the IC card or the IC module connected to the connector 313, regardless of the presence or absence of the failure of the eSIM 312. That is, according to the third embodiment, when the eSIM mounted on the base plate is replaced even if the mounted eSIM does not fail, a substantial replacement of the eSIM can be easily performed by connecting the IC card or the IC module to the connector.

Figure 4:
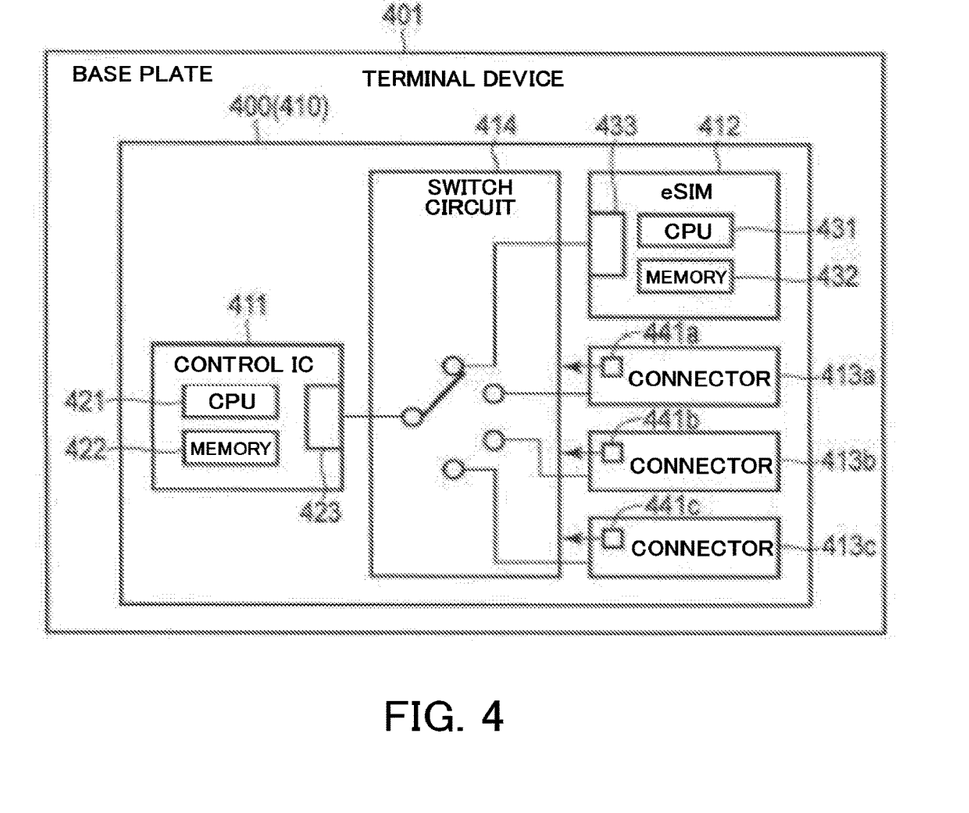
FIG. 4 is a diagram illustrating a configuration example of an electronic substrate as a modification of the third embodiment.

Further, FIG. 4 is a diagram illustrating a configuration example of an electronic substrate 400 as a modification of the third embodiment. The electronic substrate 400 illustrated in FIG. 4 is a terminal control substrate for controlling a terminal device 401. The electronic substrate 400 illustrated in FIG. 4 is a configuration example in which a plurality of connectors 413 (413a, 413b, 413c) are mounted on a base plate 410. In the electronic substrate 400, detectors 441 (441a, 441b, 441c) are respectively provided in the connectors 413 (413a, 413b, 413c). Each of the detectors 441 is connected to a switch circuit 414. Since the base material (base plate) 410, the control IC 411, and the eSIM 412 can be realized by the same elements as the base material (base plate) 310, the control IC 311, and the eSIM 312, detailed descriptions thereof will be omitted.

In addition, the individual detectors 441 (441a, 441b, 441c) can be realized by the same configuration as the detector 341 described above. The switch circuit 414 can be realized by a circuit having the same function as the switch circuit 314 described above, except that a plurality of corresponding detectors are provided. That is, any detector 341 may detect that the IC card or the IC module is connected to the connector 313. When any detector 441a (441b, 441c) detects that the IC card or the IC module is connected to the connector 413a (441b, 441c), the switch circuit 414 disconnects the eSIM 412 from the control IC 411 and connects the connector 413a (441b, 441c) to the control IC 411.

According to the modification of the third embodiment as described above, it is possible to provide an electronic substrate capable of enabling the IC card or the IC module connected to any connector 413. In addition, according to the modification of the third embodiment, it is possible to enable the IC card or the IC module connected to any connector 413, regardless of the presence or absence of the failure of the eSIM 412.

Fourth Embodiment

Figure 5:
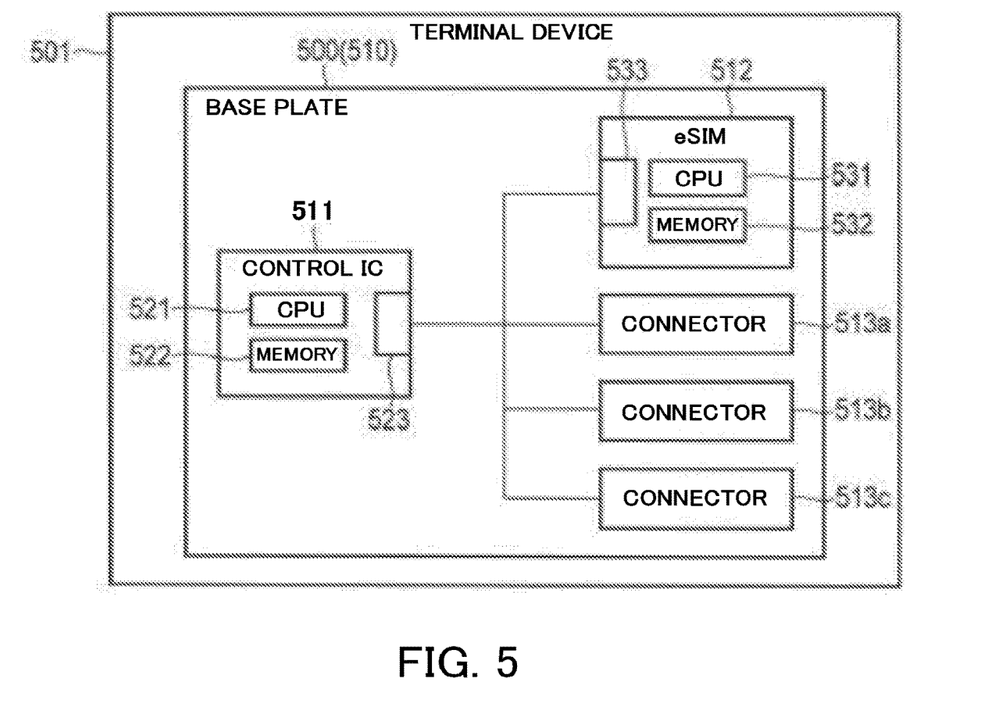
FIG. 5 is a diagram illustrating a configuration example of an electronic substrate according to a fourth embodiment.

FIG. 5 is a diagram illustrating a configuration example of an electronic substrate 500 according to a fourth embodiment. The electronic substrate 500 is a terminal control substrate for controlling a terminal device 501. The electronic substrate 500 illustrated in FIG. 5 has a configuration that does not include a switching unit such as a switch or a switch circuit. The electronic substrate 500 has a configuration in which an eSIM 512 and a connector 513 are connected to a control IC 511. The control IC 511 has a function as a switching unit for selecting and enabling any of the eSIM 512 or the connector 513 by executing a program memorized in a memory 522 by a CPU 521.

In the configuration example illustrated in FIG. 5, the electronic substrate 500 includes a base material (base plate) 510, the control IC 511, the eSIM (IC module) 512, and the connector (external connection terminal) 513. The control IC 511, the eSIM 512, and the connector 513 are mounted on the base plate 110, and the control IC 511 is connected to the eSIM 512 and the connector 513.

Since the eSIM 512 is realized by the same as the eSIM 112, detailed descriptions thereof will be omitted. In addition, since a plurality of connectors 513 (513a, 513b, 513c) can be realized by the same configuration as the plurality of connectors 213 (213a, 213b, 213c), detailed descriptions thereof will be omitted. Furthermore, one connector 513 may be mounted on the base plate 510. Moreover, a part or all of the plurality of connectors 513 may be mounted on the base plate 510 by being replaced with an eSIM separate from the eSIM 512.

The control IC 511 includes a CPU (processor) 521, a memory 522, and an interface 523. The processor 521 realizes various processing functions by executing a program memorized in the memory 522. The memory 522 includes a working memory such as a RAM, a program memory such as a ROM, a data memory such as a rewritable nonvolatile memory, and the like. In addition, the memory 522 memorizes the program which is executed by the CPU 521. Furthermore, the memory 522 memorizes setup information for processing that is performed by the CPU 521. For example, the memory 522 memorizes information indicating priority order assigned to each connector. The interface 523 is an interface for connecting to the eSIM 512 and the connector 513. In addition, the control IC 511 includes an interface for connecting to the respective units of the terminal device 501 other than the electronic substrate 500.

The CPU 521 of the control IC 511 has a function of detecting an available IC module (an IC card or an IC module connected to the eSIM and the connector) by executing a program. For example, the CPU 521 transmits a reset signal to the eSIM 512 and each connector 513 and receives a response (ATR: answer to reset) from the eSIM 512 and each connector 513. When the CPU 521 can receive the ATR, the CPU 521 determines that there is a normal or available IC card, and when there is no ATR, the CPU 521 determines that the IC card fails or there is no IC card.

In addition, the electronic substrate according to the fourth embodiment may be configured to commonly use bus lines, such as I/O, through which the control IC 511 is communicatively connected to the eSIM 512 and each connector 513. Furthermore, in the electronic substrate according to the fourth embodiment, bus lines through which the control IC 511 is communicatively connected to the eSIM 512 and each connector 513 may be respectively provided.

The CPU 521 of the control IC 511 confirms a state of the IC card in the eSIM and each connector 513 by the control according to the configuration that connects to the eSIM 512 and each connector 513. As a method by which the control IC 511 confirms the state of the IC card connected to the eSIM 512 and each connector 513, there is a method of confirming a response to a reset signal (ATR).

For example, when the bus line communicatively connected to each IC module (the eSIM and each connector) is commonly used, the CPU 521 of the control IC 511 can be configured to transmit a reset signal to each IC module and receive ATR from each IC module by securing a communication state with each IC module by using identification information (ID) or the like. In addition, when the bus line is provided for each individual IC module (the eSIM and each connector) (when a dedicated bus line is provided for each IC module), the CPU 521 of the control IC 511 can secure a communication state with each IC module through the dedicated bus line and receive ATR from each IC module. Thus, ATR is received and it is made to carry out selection control of CPU 511 to either eSIM 512 which has checked the state where it could communicate, or a connector.

Figure 6:
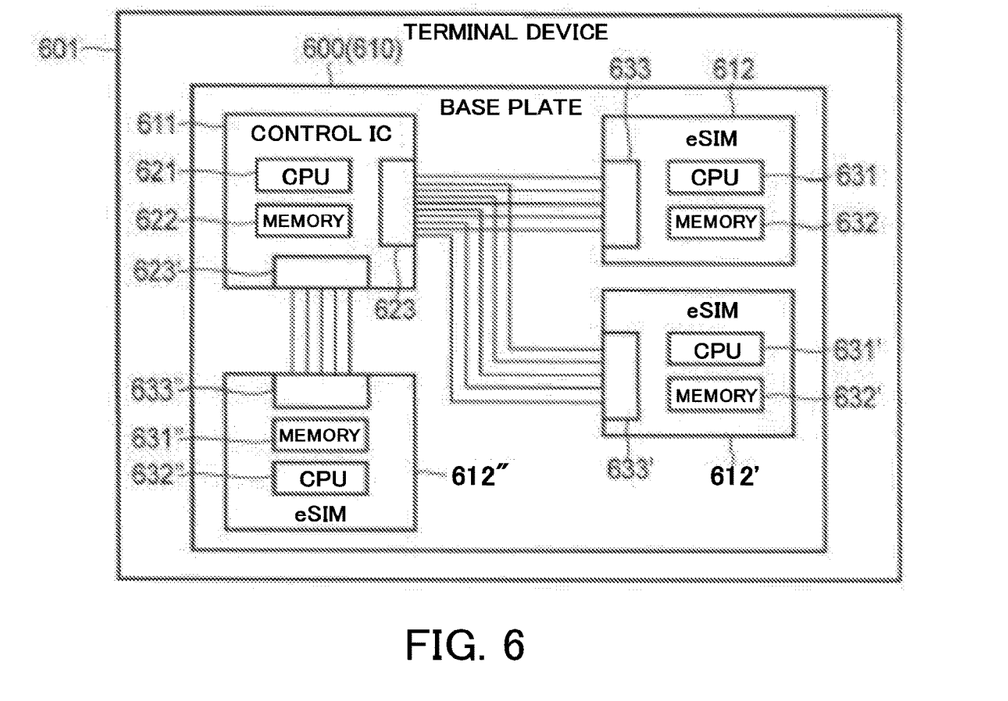
FIG. 6 is a diagram illustrating a configuration example of an electronic substrate as a modification of the fourth embodiment.

In addition, the electronic substrate according to the fourth embodiment may be configured so that, in addition to the eSIM mounted in advance, at least one connector or eSIM is connected to the control IC. Hereinafter, as a modification of the fourth embodiment, an electronic substrate having a configuration in which a plurality of eSIMs are mounted on a base plate in advance will be described. FIG. 6 is a diagram illustrating a configuration example of an electronic substrate 600 as a modification of the fourth embodiment. The electronic substrate 600 is a terminal control substrate for controlling a terminal device 601. The electronic substrate 600 illustrated in FIG. 6 does not include a physical switching unit such as a switch or a switch circuit and has a configuration in which three eSIMs 612 (612, 612', 612") are connected to a control IC 611.

The each of eSIMs 612 (612, 612', 612") have CPU (processor) 631, 631', 631", memories 632, 632', 632" and interfaces 633, 633', 633". The interface 633, 633', and 633" are the interfaces for connecting with eSIM 612 (612, 612', 612") and control IC 611. Moreover, control IC 611 also has an interface for connecting with each part other than electronic board 600 in the terminal unit 601. The control IC 611 selects and enables any of the three eSIMs 612 by executing a program memorized in a memory 622 by a CPU 621. In the configuration example illustrated in FIG. 6, the control IC 611 is configured to be connected to dedicated bus lines respectively provided in the three eSIMs 612.

Even in the configuration example illustrated in FIG. 6, the CPU 621 of the control IC 611 can transmit a reset signal to each eSIM 612 and confirm whether or not each eSIM 612 is normal, according to a reception state of ATR from each eSIM 612. In addition, in the configuration illustrated in FIG. 6, the CPU 621 of the control IC 611 is connected to each eSIM 612 through each dedicated bus line. Therefore, the CPU 621 of the control IC 611 may confirm ATR with respect to each eSIM 612 by using the dedicated bus line. In addition, by setting priority order to each eSIM 612 (612, 612', 612"), the CPU 621 of the control IC 611 can select each eSIM 612 (612, 612', 612") to be used, according to the priority order.

Figure 7:
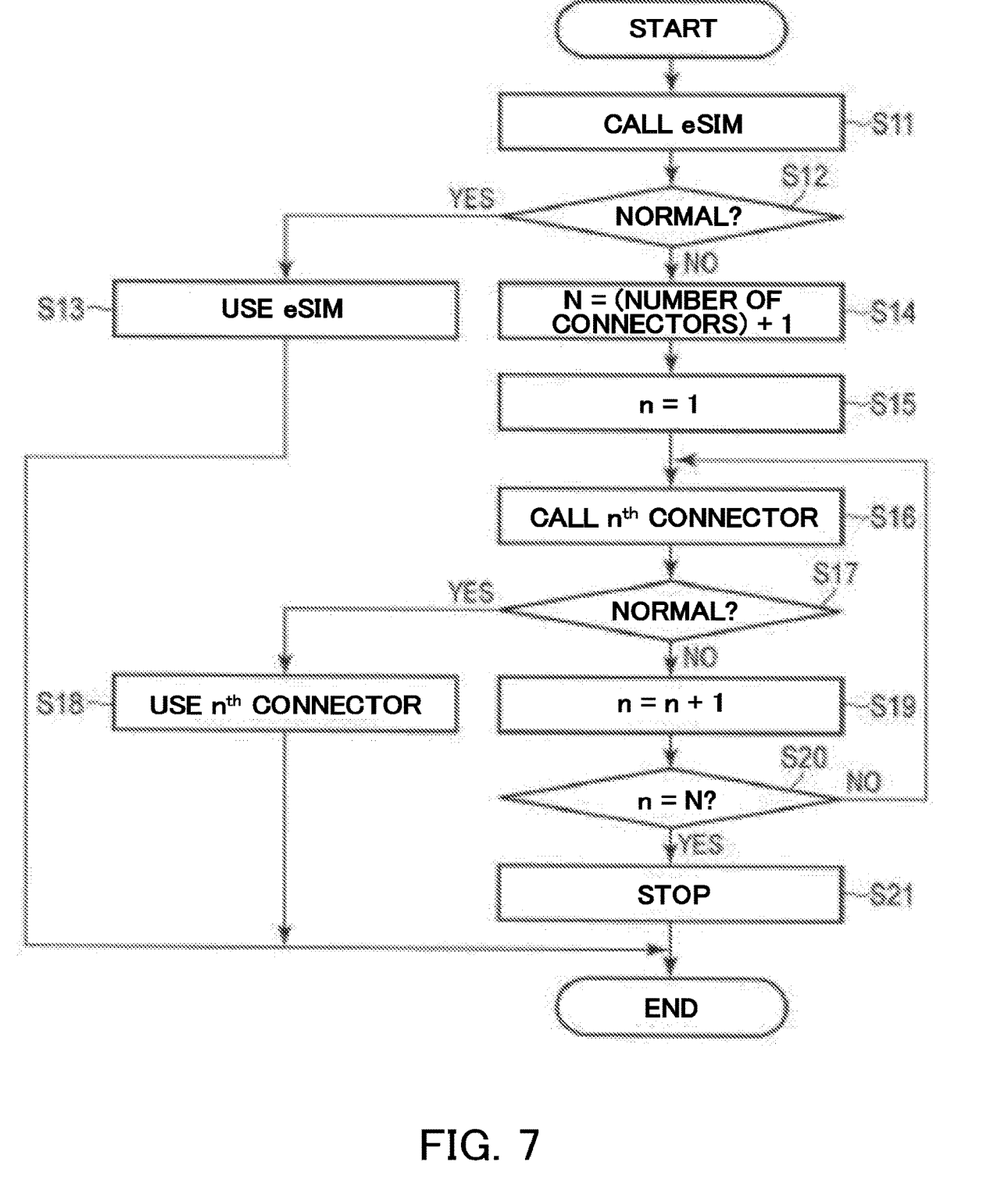
FIG. 7 is a flowchart for describing a flow of switching control in the electronic substrate according to the fourth embodiment.

Next, the switching control of the IC module (the eSIM or the connector) in the electronic substrate 500 or 600 according to the fourth embodiment will be described. FIG. 7 is a flowchart for describing the switching control of the IC module (the eSIM and the plurality of connectors) in the electronic substrate 500 according to the fourth embodiment. Here, as illustrated in FIG. 5, it is assumed that an electronic substrate has a configuration in which one eSIM and a plurality of connectors are mounted, and a case where the switching control of the IC module is performed on the eSIM as the top priority will be described. In addition, it is assumed that priority order is set to each connector 513, and the priority order is memorized in the memory 522 of the control IC 511.

When power of the terminal device 501 is turned on, or when the electronic substrate 500 is reset, the CPU 521 of the control IC 511 first calls the eSIM 512 by transmitting a reset signal to the eSIM 512 (S11). When ATR is received from the eSIM 512 with respect to the reset signal, the CPU 521 of the control IC 511 determines that the eSIM 512 is normal (S12, YES). When it is determined that the eSIM 512 is normal, the CPU 521 enables the eSIM 512 and performs control by using the eSIM 512.

In addition, when the ATR from the eSIM 512 cannot be received, the CPU 521 determines that the eSIM 512 is not normal (fails) (S12, NO). When it is determined that the eSIM 512 is not normal, the CPU 521 checks the presence or absence of an IC card capable of normally operating instead of the eSIM 512 with respect to each connector. The CPU 521 sets "(number of connectors)+1" to N (S14) and sets a variable n to 1 (n=1) as an initial value (S15).

When the variable n is set to 1, the CPU 521 specifies a $1(n)^{th}$ connector based on the priority order of the connector set in the memory 522. When an $n^{th}$ connector is specified, the CPU 521 calls an IC card connected to the $n^{th}$ connector by transmitting a reset signal to the $n^{th}$ connector (S16).

After transmitting the reset signal to the $n^{th}$ connector, the CPU 521 determines the presence or absence of an IC card capable of normally operating in the $n^{th}$ connector, according to whether or not a response (ATR) can be received from the $n^{th}$ connector (S17). When the ATR can be received from the $n^{th}$ connector (S17, YES), the CPU 521 enables the IC card connected to the $n^{th}$ connector and performs control by using the IC card (S18).

When the ATR cannot be received from the $n^{th}$ connector (S17, NO), the CPU 521 increments the variable n (n=n+1) (S19) and determines whether or not n is equal to N (whether or not n=N) (S20). When not n=N (S20, NO), the CPU 521 returns to S16 to perform the processing of S16 to S20. In addition, when n=N (S20, YES), the CPU 521 determines that a normally available IC module (eSIM or IC card) is not present, and stops the operation.

According to the processing described above, the control IC of the electronic substrate according to the fourth embodiment performs the operation as the function of the electronic substrate by preferentially using the mounted eSIM, and, when the eSIM mounted on the base plate is not normal (when the eSIM does not normally operate, or there is no normal reply including no response), checks whether or not the IC card or the IC module is connected to each connector. When it is detected that the IC card or the IC module capable of normally operating is connected to the connector, the control IC performs control by using the detected IC card or IC module.

In addition, when a plurality of connectors are present, if the mounted eSIM is not normal, the control IC checks each connector in preset priority order. When it is detected that the IC card or the IC module capable of normally operating is connected to the connector, the control IC performs control by using the detected IC card or IC module.

Due to this, even if the IC card connected to the first connector as well as the eSIM mounted on the base plate fails, the control IC can perform control by using the IC card connected to the second connector. Further, even if the IC card connected to the second connector fails, the control IC can perform control by using the IC card connected to the third connector.

Each embodiment described above will be summarized below. In the terminal control substrates according to the first and second embodiments, not only the eSIM but also at least one external connection terminal capable of connecting the IC card or the IC module are mounted. When the eSIM fails, the terminal control substrate connects the IC card or the IC module to the external connection terminal and enable the IC card or the IC module connected to the external connection terminal. Therefore, according to the first and second embodiments, even if the eSIM fails, it is possible to return to the normal operation by connecting the IC card or the IC module to the external connection terminal, and it is possible to cope with the failure inexpensively and simply.

Further, in the terminal control substrates according to the first and second embodiments, the switch is provided between the control IC and the eSIM. The switch connects one of the eSIM and the IC card, which is connected to the external connection terminal, to the control IC. In the terminal control substrate according to the first embodiment, the switch selects which one of the eSIM and the IC card connected to the external connection terminal is to be enabled. Therefore, according to the first and second embodiments, which one of the eSIM and the IC card or the IC module connected to the external connection terminal is to be enabled can be easily selected with the switch.

The terminal control substrate according to the third embodiment has a configuration in which the eSIM and at least one external connection terminal are mounted. When the IC card is connected to the external connection terminal, the terminal control substrate disconnects the mounted eSIM and enables the IC card connected to the external connection terminal. Therefore, according to the third embodiment, the eSIM mounted on the base plate can be simply replaced with the IC card connected to the external connection terminal.

The terminal control substrate according to the fourth embodiment has a configuration in which the control IC is connected to both the eSIM and the external connection terminal. The control IC checks whether or not the eSIM is normal. When it is determined that the eSIM is not normal, the control IC enables the IC card connected to the external connection terminal or another eSIM to be executed in advance. Therefore, according to the fourth embodiment, even if a failure occurs in the eSIM mounted on the base plate, the eSIM can be simply replaced with the IC card connected to the continuous external connection terminal.

In addition, the terminal control substrate according to the fourth embodiment may have a configuration in which the control IC is connected to both the eSIM and the plurality of external connection terminals. In this case, when the abnormality of the eSIM is detected, the control IC sequentially checks the connection state of the IC card to each external connection terminal according to the priority order set to each external connection terminal. When a normal IC card is detected, the control IC can enable the detected IC card.

As described above, according to each embodiment, even if the IC module or the IC card mounted on the electronic substrate fails, it is possible to control the terminal device to normally operate the electronic substrate by preparing a substitute IC card or IC module, without replacing the electronic substrate or the terminal device itself. As a result, even if a failure occurs in an electronic component, such as an eSIM, which is mounted on a base plate, the electronic substrate (for terminal control) according to each embodiment can cope with the failure at a suppressed cost, and the continuous operation of the terminal device can be performed over a long period of time.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A terminal control substrate comprising:
    a base plate mounted on a terminal device;
    a first module fixed to the base plate by solder;
    an external connection terminal fixed to the base plate and to which a second module being a substitute for the first module is attachable, the second module having same function as the first module;
    a controller configured to perform control in the terminal device by using the first module or the second module through one communication line; and
    a switching unit configured to switch a connection destination of the controller through the one communication line to any one of the first module and the external connection terminal to which the second module is attached,
    wherein,
    when the second module is attached to the external connection terminal only after the first module fixed to the base plate fails,
    the second module is used for continuous control instead of the first module by the controller through the one communication line.

2. The terminal control substrate according to claim 1, wherein the switching unit is a switch.

3. The terminal control substrate according to claim 1, wherein the external connection terminal is provided in plurality, and
    the switching unit switches the connection destination of the controller to any one of the first module and the external connection terminal to which the second module is attached.

4. The terminal control substrate according to claim 1, further comprising:
    a detector configured to detect attachment of the second module to the external connection terminal,
    wherein, when the detector detects the attachment of the second module,
    the switching unit switches the connection destination of the controller to the external connection terminal to which the second module is attached.

5. The terminal control substrate according to claim 4, wherein the external connection terminal and the detector are respectively provided in plurality, and the switching unit switches the connection destination of the controller to the external connection terminal from which the detector detects the attachment of the second module.

6. The terminal control substrate according to claim 1, wherein the first module and the second module are modules for communication authentication conforming to a specific communication protocol, and the controller performs communication control in the terminal device by using the first module or the second module.

7. A terminal control substrate comprising:
    a base plate mounted on a terminal device;
    a first module fixed to the base plate by solder;
    an external connection terminal fixed to the base plate and to which a second module capable of substituting for the first module is attachable, the second module having same function as the first module; and
    a controller connected to any one of the first module and the external connection terminal through one communication line,
    wherein,
    when the first module is normal, the controller performs control in the terminal device by using the first module through the one communication line,
    when the first module is not normal, the controller performs control in the terminal device by using the second module attached to the external connection terminal through the one communication line, and
    when the second module is attached to the external connection terminal only after the first module fixed to the base plate fails, the second module is used for continuous control instead of the first module by the controller through the one communication line.

8. The terminal control substrate according to claim 7, wherein
    the controller detects whether or not the first module or the second module attached to the external connection terminal is normal, based on a response to a reset signal supplied to the first module or the external connection terminal.

9. The terminal control substrate according to claim 7, wherein
    the external connection terminal is provided in plurality, and
    when the first module is not normal,
    the controller detects a presence or absence of attachment of the second module to the plurality of external connection terminals in a preset order, and performs control in the terminal device by using the detected second module.

* * * * *